(12) United States Patent  
Cowell, III

(10) Patent No.: US 9,099,230 B2
(45) Date of Patent: Aug. 4, 2015

(54) AMORPHOUS METAL THIN-FILM NON-LINEAR RESISTOR

(71) Applicant: E. William Cowell, III, Corvallis, OR (US)

(72) Inventor: E. William Cowell, III, Corvallis, OR (US)

(73) Assignee: STATE OF OREGON ACTING BY AND THROUGH THE STATE BOARD OF HIGHER EDUCATION ON BEHALF OF OREGON STATE UNIVESITY, Corvallis, OR (US)

( * ) Notice: Subject to any disclaimer, the term of this patent is extended or adjusted under 35 U.S.C. 154(b) by 170 days.

(21) Appl. No.: 14/066,945

(22) Filed: Oct. 30, 2013

(65) Prior Publication Data

US 2014/0368310 A1 Dec. 18, 2014

Related U.S. Application Data

(60) Provisional application No. 61/725,291, filed on Nov. 12, 2012.

(51) Int. Cl.
| | |
|---|---|
| *H01C 1/142* | (2006.01) |
| *H01C 1/14* | (2006.01) |
| *H01C 7/00* | (2006.01) |
| *H01C 17/12* | (2006.01) |
| *H01L 49/02* | (2006.01) |

(52) U.S. Cl.
CPC .............. *H01C 1/142* (2013.01); *H01C 1/14* (2013.01); *H01C 7/006* (2013.01); *H01C 17/12* (2013.01); *H01L 28/20* (2013.01); *H01L 28/24* (2013.01)

(58) Field of Classification Search
CPC ..... H01L 28/20; H01L 21/84; H01L 27/0629; H01L 27/1112; H01L 27/12; H01L 29/8605; Y10S 148/136; H01C 17/12; H01C 1/142; H01C 7/006; H01C 1/14; H01C 17/06; H01C 17/075; H01C 7/022; H01C 7/043
USPC ............. 338/327, 306, 13; 257/E21.004, 378
See application file for complete search history.

(56) References Cited

U.S. PATENT DOCUMENTS 4,855,708 A * 8/1989 Nakata et al. ................... 338/20
4,983,025 A 1/1991 Umemura (Continued)

FOREIGN PATENT DOCUMENTS

| JP | 01220473 | 9/1989 |
| JP | 07122406 | 5/1995 |
| JP | 2006032951 | 2/2006 |

OTHER PUBLICATIONS

International Preliminary Report on Patentability dated Nov. 22, 2012 corresponding to PCT/US2011/035861.

(Continued)

*Primary Examiner* — Kyung Lee
(74) *Attorney, Agent, or Firm* — Niels Haun; Dann Dorfman Herrell & Skillman, PC

(57) ABSTRACT

An amorphous metal thin-film non-linear resistor (AMNR) is provided. The AMNR is an electronic device possessing symmetric non-linear current-voltage (I-V) characteristics, an exemplary configuration of which may comprise three sequentially deposited layers which include a lower amorphous metal thin-film (AMTF) interconnect, a thin-film insulator located on top of the AMTF interconnect, and two upper conductive contacts located on top of the insulator and disposed in the same physical plane.

11 Claims, 5 Drawing Sheets

(56) References Cited

U.S. PATENT DOCUMENTS

| | | | |
|---|---|---|---|
| 5,296,726 A * | 3/1994 | MacElwee | 257/213 |
| 5,577,021 A | 11/1996 | Nakatani | |
| 5,742,471 A | 4/1998 | Barbee, Jr. et al. | |
| 5,744,817 A | 4/1998 | Shannon | |
| 6,208,234 B1 | 3/2001 | Hunt | |
| 6,376,349 B1 | 4/2002 | Tobin et al. | |
| 6,660,660 B2 | 12/2003 | Haukka et al. | |
| 6,853,185 B2 | 2/2005 | Tsukamoto et al. | |
| 6,902,763 B1 | 6/2005 | Elers et al. | |
| 7,105,852 B2 | 9/2006 | Moddel et al. | |
| 7,595,500 B2 | 9/2009 | Moddel et al. | |
| 8,822,978 B2 * | 9/2014 | Cowell et al. | 257/29 |
| 2005/0077519 A1 | 4/2005 | Ahn | |
| 2006/0071340 A1 | 4/2006 | Zhong | |
| 2006/0177975 A1 | 8/2006 | Ahn | |
| 2007/0229212 A1 | 10/2007 | Ballantine | |
| 2007/0274121 A1 | 11/2007 | Lung | |
| 2008/0038293 A1 | 2/2008 | Vaughn | |
| 2008/0121962 A1 | 5/2008 | Forbes | |
| 2010/0214719 A1 | 8/2010 | Kim | |
| 2010/0289005 A1 | 11/2010 | Cowell | |
| 2010/0301452 A1 | 12/2010 | Wang | |
| 2014/0302310 A1 * | 10/2014 | Cowell et al. | 428/336 |

OTHER PUBLICATIONS

International Search Report dated Jan. 24, 2012 (Application No. PCT/US2011/35861).

International Search Report dated Jun. 13, 2012 (Application No. PCT/US2012/029684).

Matsumoto et al., "In situ analysis of the thermal behavior in the Zr-based multi-component metallic thin film by pulsed laser deposition combined with UHV-laser microscope system," Materials Science and Engineering B 148:179-182, 2008.

Sharma et al., "Nanoscale Patterning of Zr—Al—Cu—Ni Metallic Glass Thin Films Deposited by Magnetron Sputtering," Journal of Nanoscience and Nanotechnology 5:416-420, 2005.

Written Opinion dated Jan. 24, 2012 (Application No. PCT/US2011/35861).

Written Opinion dated Jun. 13, 2012 (Application No. PCT/US2012/029684).

Written Opinion dated Feb. 7, 2014 (Application No. PCT/US2013/067443).

International Search Report dated Feb. 7, 2014 (Application No. PCT/US2013/067443).

* cited by examiner

_US 9,099,230 B2_

AMORPHOUS METAL THIN-FILM NON-LINEAR RESISTOR

GOVERNMENT LICENSE RIGHTS

This invention was made with government support under CHE-1102637 awarded by the National Science Foundation. The government has certain rights in the invention.

RELATED APPLICATIONS

This application claims the benefit of priority of U.S. Provisional Application No. 61/725,291, filed on Nov. 12, 2012, the entire contents of which application are incorporated herein by reference.

FIELD OF THE INVENTION

The present invention relates generally to an amorphous metal thin-film non-linear resistor (AMNR), which is an electronic device possessing symmetric non-linear current-voltage (I-V) characteristics, an exemplary configuration of which may comprise three sequentially deposited layers which include a lower amorphous metal thin-film (AMTF) interconnect, a thin-film insulator located on top of the AMTF interconnect, and two upper conductive contacts located on top of the insulator and located in the same physical plane.

BACKGROUND OF THE INVENTION

A resistor is an electronic device that typically has symmetric current-voltage (I-V) characteristics with respect to the polarity of the applied voltage. Existing thin-film non-linear resistors, however, suffer from a lack of I-V symmetry with respect to the polarity of the applied voltage. This lack of symmetry greatly limits the use of such non-linear resistors in a large variety of applications, including signal control for use in liquid crystal or organic light emitting diode display backplanes and electro-magnetic sensor arrays, for example. Thus, it would be an important advance in the art to provide thin-film non-linear resistors that exhibit I-V symmetry with respect to the polarity of the applied voltage.

SUMMARY OF THE INVENTION

In one of its aspects, the present invention provides an amorphous metal thin-film nonlinear resistor (AMNR) possessing symmetric nonlinear current-voltage characteristics, comprising an amorphous metal interconnect, an insulator layer disposed over the interconnect, and first and second electrical contacts disposed over the insulator layer and interconnect, each connector having at least a respective portion thereof overlapping a respective portion of the interconnect to provide electrical communication from the first contact through the insulator layer and amorphous metal interconnect to the second contact. The AMNR may be configured such that a voltage applied across the first and second electrical contacts results in an electrical current that varies nonlinearly with, and symmetrically with polarity of, the applied voltage. The amorphous metal thin-film (AMTF) interconnect may contain at least two of the elements aluminum, titanium, zirconium, copper, nickel, tantalum, tungsten, boron, or silicon and may comprise levels of oxygen, nitrogen, and carbon making up less than 5% of the atomic composition of the AMTF interconnect. The insulator may include an oxide material containing oxygen and one of the elements aluminum, titanium, zirconium, hafnium, tantalum, or silicon, while the contacts may comprise a conductive material made of the metallic elements aluminum, chromium, molybdenum, titanium, copper, and nickel, the indium tin oxide, and combinations thereof. Desirably, the AMTF interconnect may have a root mean square surface roughness of less than about 2 nm and may have a resistivity greater than 125 $\mu\Omega$-cm and less than 400 $\mu\Omega$-cm.

In an additional aspect, the present invention provides a method of fabricating an amorphous metal thin-film nonlinear resistor, comprising depositing an AMTF interconnect on a substrate, depositing an insulator layer over the interconnect, and forming first and second electrical contacts over the insulator layer and interconnect, each connector having at least a respective portion thereof overlapping a respective portion of the interconnect to provide electrical communication from the first contact through the insulator layer and amorphous metal interconnect to the second contact. The step of depositing the AMTF interconnect layer may include one or more of direct current magnetron sputtering and radio frequency magnetron sputtering, and the step of depositing the insulator layer may include one or more of atomic layer deposition, plasma enhanced chemical vapor deposition, radio frequency magnetron sputtering, aqueous solution deposition, and mist deposition. The step of forming the first and second electrical contacts may include one or more of thermal evaporation, direct current magnetron sputtering, radio frequency magnetron sputtering, and electron beam deposition.

BRIEF DESCRIPTION OF THE DRAWINGS

The foregoing summary and the following detailed description of the preferred embodiments of the present invention will be best understood when read in conjunction with the appended drawings, in which.

DETAILED DESCRIPTION OF THE INVENTION

In one of its aspects, the present invention provides an amorphous metal thin-film non-linear resistor (AMNR), an electronic device through which electronic current magnitude increases non-linearly (e.g., exponentially) with increasing potential voltage difference applied between two contacts.

The characteristic increase in current magnitude is similar for both positive and negative applied potential voltage differences (i.e., polarity symmetric current-voltage characteristics). As such, the AMNR of the present invention may find utility in a wide range of electronic applications where non-linear resistive devices are appropriate for signal control, such as liquid crystal or organic light emitting diode display backplanes, electro-magnetic sensor arrays, or over-voltage circuit protection schemes.

Figure 1A:
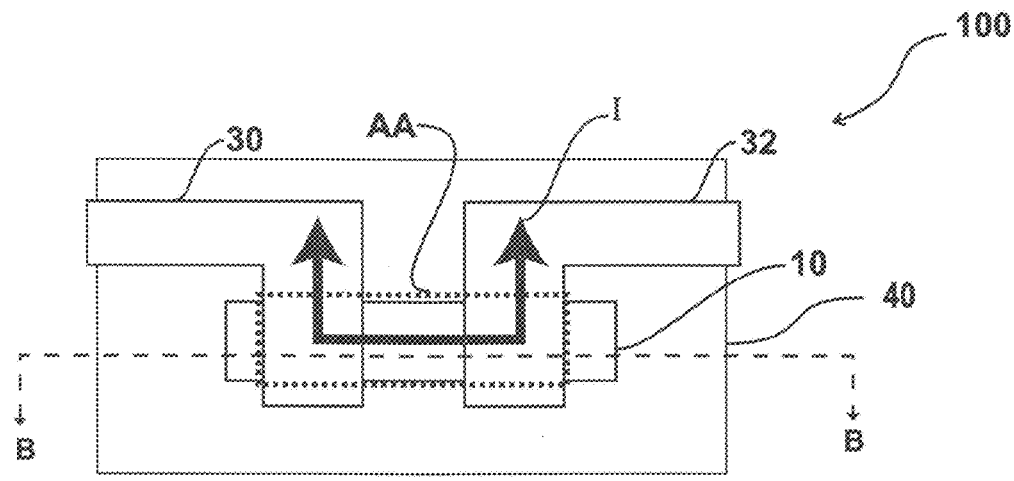
FIGS. 1A, 1B schematically illustrate an exemplary configuration of an amorphous metal thin-film non-linear resistor (AMNR) in accordance with the present invention in top-down view and cross-sectional view taken along B-B, respectively.
Figure 1B:
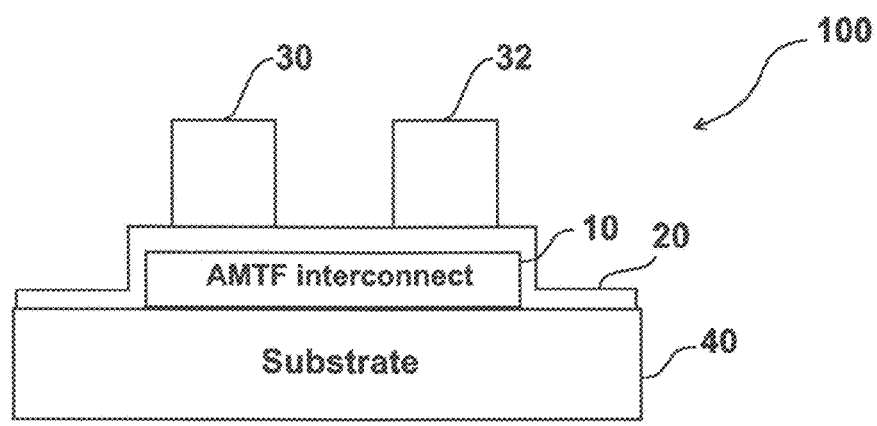

Turning to FIGS. 1A-1B, an exemplary AMNR 100 is illustrated which comprises three thin-film layers, shown in top-down and side cross-sectional views, respectively. The amorphous metal thin-film (AMTF) interconnect 10 may be provided as a patterned layer which is deposited via direct current (DC) magnetron sputtering, radio frequency (RF) magnetron sputtering, or other suitable process onto a substrate 40. Without intending to be bound by any particular theory, it is believed important that the surface of the AMTF interconnect 10 be ultra-smooth, with a root mean square (RMS) surface roughness of less than 2 nm. The AMTF interconnect 10 is conductive and may have resistivity greater than 125 μΩ-cm and less than 400 μΩ-cm, for example, and thickness less than 1 micron. The composition of the AMTF interconnect 10 may contain at least two metallic components chosen from the metallic elements of aluminum, titanium, zirconium, copper, nickel, tantalum, or tungsten, for example. The AMTF interconnect 10 may also contain boron or silicon.

An insulator 20 of thickness less than 200 nm may be deposited onto the AMTF interconnect 10 via atomic layer deposition (ALD), plasma enhanced chemical vapor deposition (PECVD), RF magnetron sputtering, aqueous solution deposition, or other suitable process, for example. The insulator 20 may include a metal oxide with metallic or metalloid components such as aluminum, zirconium, hafnium, tantalum, titanium, silicon or boron.

The top layer of the AMNR 100 may comprise two conductive thin-film contacts 30, 32 between which electrical current, I, flows, FIG. 1A. The upper contacts 30, 32 may be deposited via DC or RF magnetron sputtering, thermal evaporation, electron-beam deposition, or other suitable process, for example, and the composition of the upper contacts 30, 32 may be metallic aluminum, chromium, molybdenum, nickel, copper, titanium, or a conductive metal oxide of indium tin oxide.

The contacts 30, 32 may be configured to cross the lower AMTF interconnect 10 and control the dimensions of the AMNR active area, AA, which is the region bound by the dashed lines as shown in FIG. 1A. The AMTF interconnect 10, combined with the dimensions of the AMNR upper contacts 30, 32, determine the dimension of the AMNR active area, AA. Specifically, the active area, AA, of the AMNR 100 may be defined as the area where the upper contacts 30, 32 overlap the amorphous metal interconnect 10 as well as the interconnect area between the contacts 30, 32. Without intending to be bound by any particular theory, the AMNR active area dimension is believed to directly relate to the current-voltage (I-V) characteristics of the AMNR 100, with the interfaces where the upper contacts 30, 32 overlap the amorphous metal interconnect 10 believed to have the greatest contribution to the I-V characteristics. For example, by increasing or decreasing the AMNR active area, AA, the attainable current magnitude realized between the upper contacts 30, 32, at the same applied voltage difference between the contacts 30, 32, may be increased or decreased, respectively. Modulation of AMNR active area, AA, allows for the modulation of AMNR current-voltage characteristics which creates the ability to coincidentally fabricate a wide variety of AMNR's through the patterning of the amorphous metal interconnects and upper contacts.

The size of the AMNR active area, AA, may be engineered towards the maximum current magnitude required by an electronic application. Currents near $5 \times 10^{-6}$ A are readily achieved through an AMNR with active area of $1.25 \times 10^{-9}$ m$^2$. Current magnitude scales linearly with AMNR active area. Therefore, current magnitudes of $1 \times 10^{-3}$ A may require an AMNR active area on the order of $1.25 \times 10^{-6}$ m$^2$. Through the control of the AMNR active area, maximum current magnitudes between $1 \times 10^{-9}$ A and $1 \times 10^{-3}$ A may be realized.

The patterning of the AMNR amorphous metal thin-film interconnect 10 and/or upper contacts 30, 32 may be accomplished through either photolithographic patterning or selective deposition or other suitable processes. Photolithographic patterning transfers a pattern into a blanket film of material (i.e., a thin-film of amorphous metal) through the use of photo-resist coupled with the physical removal of the film material in areas lacking photo-resist. Selective deposition creates a patterned film by allowing patterned deposition of a film material through the use of a shadow-mask. The dimension of the areal overlap between an upper contact and the lower amorphous metal interconnect may be between $1 \times 10^{-12}$ m$^2$ and $1 \times 10^{-6}$ m$^2$. The thickness of the insulator 20 between the AMTF interconnect 10 and the upper contacts 30, 32 may also control the I-V characteristics of the AMNR 100. While the AMTF interconnect 10 and upper contacts 30, 32 may be formed to have desired shapes (e.g., patterned), the insulator 20 may or may not be patterned.

Figure 2A:
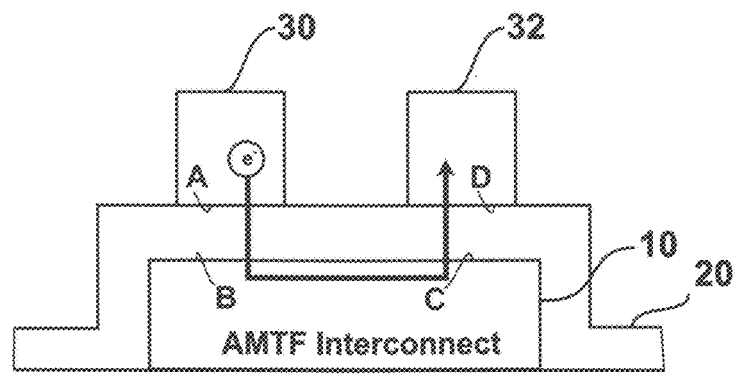
FIGS. 2A, 2B schematically illustrate the conduction path of an electron traveling through an AMNR from the first contact to the second contact and the resistive changes experienced by conducting electrons traveling between contacts, respectively.

FIG. 2A presents the path of an electron, through the AMNR 100, from contact 30 to contact 32. The path of an electron between the two contacts 30, 32 crosses the two interfaces formed between the contacts 30, 32 and the insulator 20 (interfaces A and D) and the two interfaces formed between the insulator 20 and the AMTF interconnect 10 (interfaces B and C). Interfaces A, D may be formed coincidentally when the upper contacts 30, 32 are deposited onto the insulator 20, and therefore have identical resistance to electronic conduction. Analogously, interfaces B, C may be formed coincidentally when the insulator 20 is deposited onto the AMTF interconnect 10 and present identical resistance to electronic conduction.

Figure 2B:
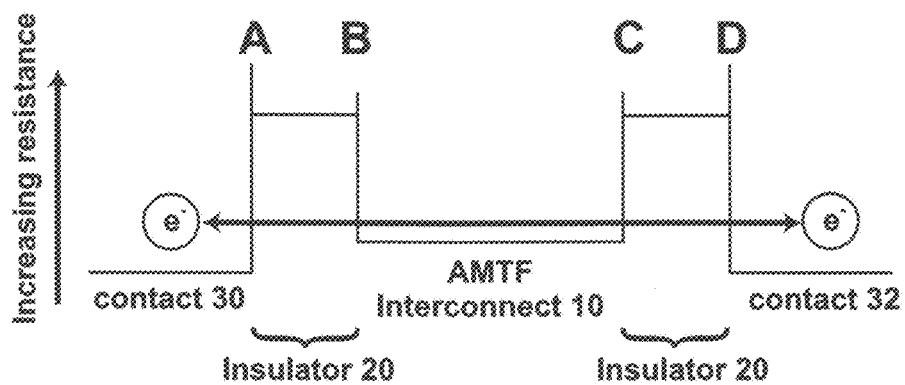

FIG. 2B schematically illustrates the resistance to conduction experienced by an electron travelling between the upper contacts 30, 32, and graphically represents the polarity symmetry of the AMNR 100. The metal resistances (i.e., the resistance of the upper contacts 30, 32 and the AMTF interconnect 10) may be lower than the resistance of the insulator 20. The resistance of the insulator 20 may be high relative to the resistance of the metal layers, i.e., contacts 30, 32, and may dominate the total resistance of the AMNR 100. The resistances at the interfaces A, B, C, D may be high relative to that of the metal layers, i.e., contacts 30, 32. FIG. 2B shows that the resistive changes encountered by conducting electrons are identical in the path from contact 30 to contact 32 and from contact 32 to contact 30. Therefore the AMNR resistance is the same whether contact 30 has a higher voltage applied relative to contact 32, or contact 32 has a higher voltage applied relative to contact 30. The identical resistances in either voltage application scenario cause symmetric AMNR I-V characteristics. It is of note that the resistances of the interfaces A, B, C, D are shown to be higher than the resistance of the insulator 20 resistance, but may be lower depending on the fabrication techniques used to deposit the films and the materials used.

Figure 3A:
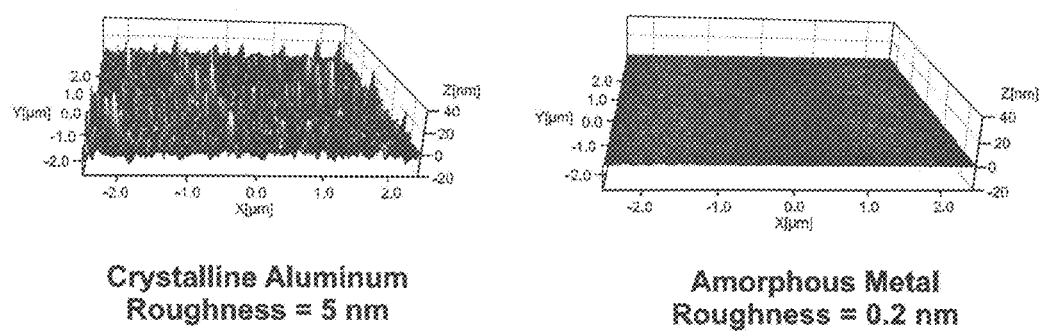
FIG. 3A illustrates atomic force microscope data of surface roughness for a crystalline aluminum thin-film and an amorphous metal thin-film.

In order to achieve I-V symmetry in the fashion described by FIG. 2B, the AMTF interconnect 10 should possess an ultra-smooth surface. As represented in FIG. 2B, the largest resistance experienced by a conducting electron in an AMNR is located between the upper contacts 30, 32 and the AMTF interconnect 10 (i.e., the interfaces A, B, C, D and the insulator 20). The resistances of the contacts 30, 32 and the AMTF interconnect 10 are significantly lower. Therefore, the I-V characteristics of the AMNR 100 are dominated by the electronic conduction between the contacts 30, 32 and the AMTF interconnect 10, which includes the interfaces A, B, C, D and the insulator 20. Surface roughness degrades interfacial quality and insulator 20 uniformity across the AMNR active area, AA, which increases device asymmetry. FIG. 3A presents surface morphology data of a crystalline metal and an AMTF. The data are measured over the same areas using atomic force microscopy (AFM) and are presented with the axes of the same scale. The AMTF surface is significantly smoother, 0.2 nm RMS, than the crystalline metal surface, 5 nm RMS.

Figure 3B:
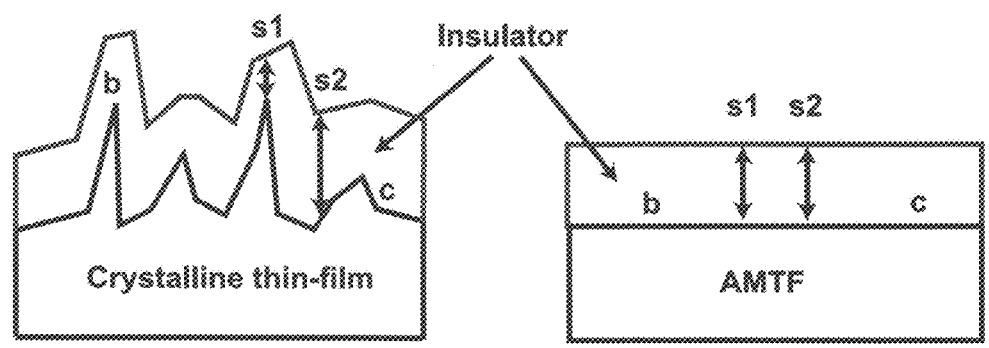
FIG. 3B schematically represents the effect that surface roughness has on insulator thickness and interfacial quality for crystalline and amorphous thin-films.

FIG. 3B schematically illustrates an advantage of an ultra-smooth AMTF surface morphology interconnect over a rough crystalline metal interconnect with respect to AMNR I-V symmetry. To create I-V symmetry, the interface between the interconnect 10 and the insulator 20 should be homogeneous over the AMNR active area, AA. Surface roughness can affect the deposition of an insulator such that the deposited insulator thickness on a high point of a rough film (e.g., point b) differs from the deposited insulator thickness at a low point (e.g., point c), FIG. 3A. A deposition on a smooth film creates a homogeneous interface such that points b and c possess identical interfacial characteristics, such as deposited insulator thickness, FIG. 3B.

The effect that surface roughness has on insulator thickness also contributes to degraded symmetry in an AMNR fabricated with a rough interconnect. The electronic conduction mechanisms through the insulator 20 of an AMNR 100 are correlated to the electric field applied across the insulator 20. The electric field, E, applied across an insulator 20 is equal to the voltage across the insulator, V, divided by the insulator thickness, s. As illustrated in FIG. 3B, the thickness of an insulator 20 deposited onto a rough film varies (i.e., s1≠s2), while the thickness of an insulator 20 deposited on an ultra-smooth insulator 20 is uniform (i.e., s1=s2). Conducting electrons experience non-homogeneous electric fields in an AMNR fabricated with a rough interconnect, while conducting electrons experience homogeneous electric fields in an AMNR fabricated with an ultra-smooth AMTF interconnect. The ultra-smooth surface of an AMTF interconnect can thus enable AMNR I-V symmetry.

Electronic conduction through the insulator 20 of the AMNR 100 can dominate the I-V characteristics of the device. The choice of insulator material therefore determines the current conduction mechanism of the AMNR 100. The I-V characteristics of the AMNR 100 may be modulated by varying the material composition of the amorphous metal interconnect 10, the upper contacts 30, 32, and/or the insulator 20. The composition of the amorphous metal interconnect 10 participates in the determination of the interfacial electrical properties at the interface between the amorphous metal 10 and insulator 20. Analogously, the composition of the upper contact material influences the electrical properties of the interface between the insulator 20 and contacts 30, 32. The composition of the insulator 20 impacts both interfaces as well as the electrical properties of the insulator 20 itself.

The I-V characteristic of the AMNR 100 may be mathematically described as an exponential relationship between an applied voltage, V, and a resulting current, I. There are two exponential forms of the exponential I-V characteristic, $$I \propto \exp\left(\frac{-C_1}{V}\right), \quad (1)$$

and $$I \propto \exp(C_2 \sqrt{V}), \quad (2)$$

where $C_1$ is a constant relating to the electron effective mass, the barrier height at the injecting interface, and the thickness of the insulator, and $C_2$ is a constant related to the square root of the inverse of the insulator dielectric constant, the dielectric thickness, and the depth of electron traps in the band gap. Through selection of the AMNR materials and fabrication techniques, the AMNR I-V characteristics can be engineered to resemble Eq. 1, Eq. 2, or a combination of Eqs. 1 and 2. Control of AMNR I-V characteristics is made possible through the ultra-smooth AMTF surface which creates pristine AMTF interconnect/insulator and insulator/upper contact interfaces and uniform insulator thickness.

EXAMPLE

Figure 4A:
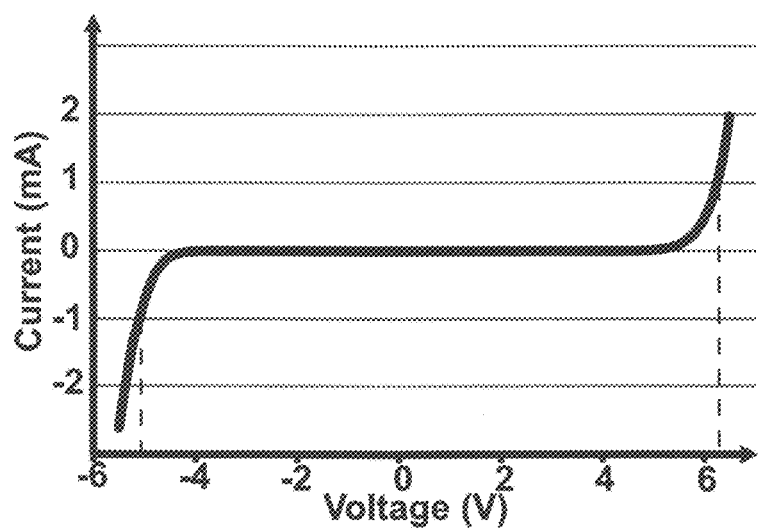
FIG. 4A illustrates current-voltage characteristics of a metal-insulator-metal (MIM) diode fabricated with an amorphous metal thin-film (AMTF) lower electrode, an $Al_2O_3$ insulator, and an aluminum upper electrode.

A comparison of I-V characteristics between a metal-insulator-metal (MIM) diode fabricated with an AMTF lower electrode and the AMNR 100 illustrates the difference in symmetry between the two devices. FIG. 4A presents the I-V characteristics of a MIM diode which possess a TiAl AMTF lower electrode, an $Al_2O_3$ insulator, and an aluminum upper electrode. The voltage magnitude at which a current magnitude of 1 μA was attained was 5.1 V in the negative polarity and 6.3 V in the positive polarity.

Figure 4B:
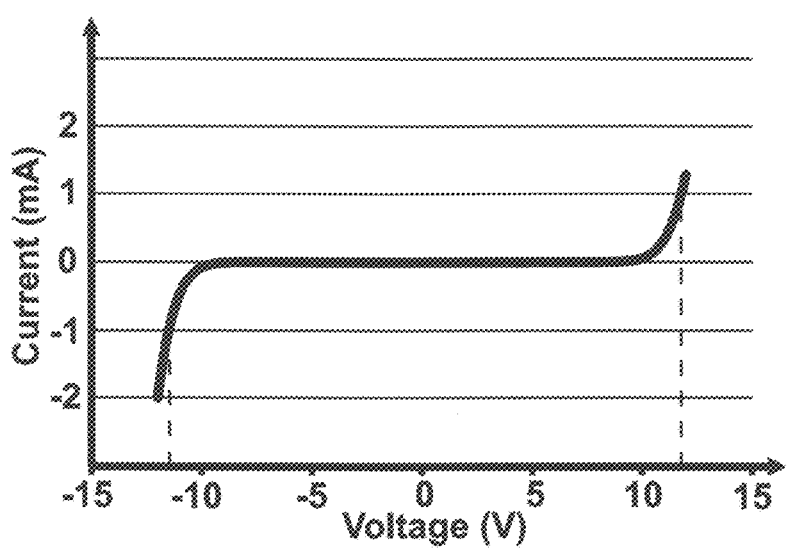
FIG. 4B illustrates current-voltage characteristics of an AMNR fabricated concurrently with the MIM diode shown in FIG. 4A, the AMNR possessing an AMTF interconnect, an $Al_2O_3$ insulator, and aluminum upper contacts.

FIG. 4B presents the I-V characteristics of an AMNR that was fabricated concurrently with the MIM diode shown in FIG. 4A. The AMNR 100 had a TiAl AMTF interconnect 10, an $Al_2O_3$ insulator 20, and aluminum upper contacts 30, 32. The voltage magnitude at which a current magnitude of 1 μA was attained was 11.8 in the negative polarity and 11.6 in the positive polarity. The AMNR 100 was therefore shown to possess symmetric I-V characteristics and represents a new class of thin-film electronic device. The insulator layer in both devices was 10 nm thick. The overlapped area between contact(s) and interconnect of both devices was $1 \times 10^{-8}$ $m^2$. Note that the AMNR had two of these areas, so the total area determining the current was $2 \times 10^{-8}$ $m^2$. Both exemplary devices were processed coincidentally on the same substrate through: 1) DC magnetron sputtering and shadow-masked patterning of the 200 nm thick TiAl lower electrode (MIM) and 200 nm thick lower interconnect (AMNR), 2) atomic layer deposition (ALD) of the $Al_2O_3$ insulator, and 3) thermal evaporation and shadow-masked patterning of the 500 nm thick Al upper electrode (MIM) and 500 nm thick upper contacts (AMNR). The DC magnetron sputtering of the TiAl layers was executed using an Ar plasma gas at a flow of 20 sccm and a pressure of 3 mTorr using a power of 60 W with a circular TiAl target having an Al to Ti ratio of 3 to 1, a 3 inch radius and a 0.25 inch thickness. The ALD deposition employed alternating pulses of trimethylaluminum and de-ionized water at a temperature of 300° C. The thermal evaporation of the upper contacts used a solid Al clip source and was undertaken at a vacuum of 30 mTorr.

These and other advantages of the present invention will be apparent to those skilled in the art from the foregoing specification. Accordingly, it will be recognized by those skilled in the art that changes or modifications may be made to the above-described embodiments without departing from the broad inventive concepts of the invention. It should therefore be understood that this invention is not limited to the particular embodiments described herein, but is intended to include all changes and modifications that are within the scope and spirit of the invention as set forth in the claims.

What is claimed is:

1. An amorphous metal thin-film nonlinear resistor possessing symmetric nonlinear current-voltage characteristics, comprising:
   an amorphous metal thin-film interconnect;
   an insulator layer disposed over the interconnect; and
   first and second electrical contacts disposed over a selected surface of the insulator layer and interconnect, each connector having at least a respective portion thereof overlapping a respective portion of the interconnect to provide electrical communication from the first contact through the insulator layer and amorphous metal interconnect to the second contact,
   whereby a voltage applied across the first and second electrical contacts results in an electrical current that varies nonlinearly with, and symmetrically with polarity of, applied voltage.

2. The amorphous metal thin-film nonlinear resistor according to claim 1, wherein the amorphous metal thin-film interconnect contains at least two of the elements aluminum, titanium, zirconium, copper, nickel, tantalum, tungsten, boron, or silicon.

3. The amorphous metal thin-film nonlinear resistor according to claim 1, wherein the amorphous metal thin-film interconnect comprises levels of oxygen, nitrogen, and carbon making up less than 5% of the atomic composition of the amorphous metal interconnect.

4. The amorphous metal thin-film nonlinear resistor according to claim 1, wherein the insulator comprises an oxide material containing oxygen and one of the elements aluminum, titanium, zirconium, hafnium, tantalum, or silicon.

5. The amorphous metal thin-film nonlinear resistor according to claim 1, wherein the contacts comprise a conductive material made of the metallic elements aluminum, chromium, molybdenum, titanium, copper, and nickel, the indium tin oxide, and combinations thereof.

6. The amorphous metal thin-film nonlinear resistor according to claim 1, wherein amorphous metal thin-film interconnect has a root mean square surface roughness of less than about 2 nm.

7. The amorphous metal thin-film nonlinear resistor according to claim 1, wherein amorphous metal thin-film interconnect has a resistivity greater than 125 $\mu\Omega$-cm and less than 400 $\mu\Omega$-cm.

8. A method of fabricating an amorphous metal thin-film nonlinear resistor, comprising:
   depositing an amorphous metal thin-film interconnect on a substrate;
   depositing an insulator layer over the interconnect; and
   forming first and second electrical contacts over a selected surface of the insulator layer and interconnect, each connector having at least a respective portion thereof overlapping a respective portion of the interconnect to provide electrical communication from the first contact through the insulator layer and amorphous metal interconnect to the second contact,
   whereby a voltage applied across the first and second electrical contacts results in an electrical current that varies nonlinearly with, and symmetrically with polarity of, applied voltage.

9. The method according to claim 8, wherein the step of depositing the amorphous metal thin-film interconnect layer comprises one or more of direct current magnetron sputtering and radio frequency magnetron sputtering.

10. The method according to claim 8, wherein the step of depositing the insulator layer comprises one or more of atomic layer deposition, plasma enhanced chemical vapor deposition, radio frequency magnetron sputtering, aqueous solution deposition, and mist deposition.

11. The method according to claim 8, wherein the step of forming the first and second electrical contacts comprises one or more of thermal evaporation, direct current magnetron sputtering, radio frequency magnetron sputtering, and electron beam deposition.

* * * * *